(12) United States Patent
Wild et al.

(10) Patent No.: US 10,821,925 B2
(45) Date of Patent: Nov. 3, 2020

(54) APPARATUS AND METHOD FOR ASSISTING A USER

(71) Applicant: Volkswagen AG, Wolfsburg (DE)

(72) Inventors: Holger Wild, Berlin (DE); Nils Kotter, Braunschweig (DE)

(73) Assignee: Volkswagen AG, Wolfsburg (DE)

( * ) Notice: Subject to any disclaimer, the term of this patent is extended or adjusted under 35 U.S.C. 154(b) by 10 days.

(21) Appl. No.: 14/972,960

(22) Filed: Dec. 17, 2015

(65) Prior Publication Data

US 2016/0193976 A1 Jul. 7, 2016

(30) Foreign Application Priority Data

Jan. 2, 2015 (DE) .................... 10 2015 200 006

(51) Int. Cl.
| | | |
|---|---|---|
| *B60R 16/037* | (2006.01) | |
| *G06F 3/044* | (2006.01) | |
| *G06F 3/0488* | (2013.01) | |
| *B60N 2/02* | (2006.01) | |
| *G06F 3/01* | (2006.01) | |
| *H03K 17/96* | (2006.01) | |

(Continued)

(52) U.S. Cl.
CPC ............ *B60R 16/037* (2013.01); *B60K 35/00* (2013.01); *B60K 37/06* (2013.01); *B60N 2/0228* (2013.01); *G06F 3/017* (2013.01); *G06F 3/044* (2013.01); *G06F 3/04847* (2013.01); *G06F 3/04883* (2013.01); *H03K 17/962* (2013.01); *B60K 2370/141* (2019.05); *B60K 2370/199* (2019.05); *G06F 2203/04101* (2013.01); *H03K 2217/96079* (2013.01); *H03K 2217/960755* (2013.01)

(58) Field of Classification Search
None
See application file for complete search history.

(56) References Cited

U.S. PATENT DOCUMENTS

| | | | | |
|---|---|---|---|---|
| 6,774,505 | B1 * | 8/2004 | Wnuk ................. | B60N 2/0228 307/10.8 |
| 7,447,575 | B2 * | 11/2008 | Goldbeck ............ | G06F 3/0488 701/36 |

(Continued)

FOREIGN PATENT DOCUMENTS

| | | | |
|---|---|---|---|
| DE | 10015726 A1 * | 10/2001 | ............ B60K 35/00 |
| DE | 103 42 666 A1 | 4/2005 | |

(Continued)

OTHER PUBLICATIONS

Machine translation of JP-2010235065-A, Hirota, Oct. 2010, espacenet. com.*

(Continued)

*Primary Examiner* — David P. Merlino
(74) *Attorney, Agent, or Firm* — Barnes & Thornburg LLP

(57) ABSTRACT

A device and method for providing support to a user prior to activating a switch to electromotively adjust a component of a transportation means is disclosed. The transportation means and a device and a method for assisting a user prior to an activating of a switch for electric motor adjustment of a component of a transportation means are disclosed. The method comprises the steps of recognizing of an approach of the user to a first switch and in response displaying of a prompt to a function coordinated with the first switch.

18 Claims, 6 Drawing Sheets

(51) Int. Cl.
*G06F 3/0484* (2013.01)
*B60K 37/06* (2006.01)
*B60K 35/00* (2006.01)

(56) References Cited

U.S. PATENT DOCUMENTS

| | | | | |
|---|---|---|---|---|
| 8,032,280 | B2* | 10/2011 | Shibata | H01H 13/705 307/10.8 |
| 2007/0085423 | A1* | 4/2007 | Chin | B60K 37/06 307/101 |
| 2008/0158190 | A1* | 7/2008 | Waeller | B60K 35/00 345/173 |
| 2010/0066137 | A1* | 3/2010 | Sakai | B60N 2/002 297/217.3 |
| 2010/0286867 | A1* | 11/2010 | Bergholz | B60K 35/00 701/36 |
| 2011/0106446 | A1* | 5/2011 | Waeller | B60K 35/00 701/533 |
| 2011/0234502 | A1* | 9/2011 | Yun | G06F 3/016 345/173 |
| 2013/0076121 | A1* | 3/2013 | Salter | B60J 7/0573 307/9.1 |
| 2013/0200991 | A1* | 8/2013 | Ricci | B60K 37/06 340/4.3 |
| 2013/0261871 | A1* | 10/2013 | Hobbs | B60K 37/06 701/28 |
| 2014/0081521 | A1* | 3/2014 | Frojdh | B60R 16/037 701/36 |
| 2014/0229174 | A1* | 8/2014 | Graumann | G06F 3/167 704/231 |
| 2014/0306724 | A1* | 10/2014 | Dassanayake | H03K 17/955 324/658 |
| 2014/0309871 | A1* | 10/2014 | Ricci | B60R 16/037 701/36 |
| 2015/0019083 | A1* | 1/2015 | Kalliomaki | E05F 15/695 701/49 |
| 2015/0353097 | A1* | 12/2015 | Graham | B60R 16/037 701/48 |

FOREIGN PATENT DOCUMENTS

| | | | |
|---|---|---|---|
| DE | 10 2005 054 171 A1 | 5/2007 | |
| DE | 10 2006 003174 A1 | 7/2007 | |
| DE | 10 2009 026902 A1 | 1/2010 | |
| DE | 10 2009 007707 A1 | 8/2010 | |
| DE | 102010048746 A1 * | 4/2012 | ............ B60K 35/00 |
| DE | 10 2011 018378 A1 | 10/2012 | |
| DE | 102011018378 A1 * | 10/2012 | .......... B60N 2/0224 |
| DE | 102012216181 A1 * | 6/2014 | .......... B60N 2/0228 |
| EP | 1228917 A1 * | 8/2002 | ............ B60K 37/06 |
| EP | 1228917 A1 | 8/2002 | |
| JP | 2009 269528 A | 11/2009 | |
| JP | 2010069917 A | 4/2010 | |
| JP | 2010235065 A * | 10/2010 | |
| WO | 2007121977 A2 | 11/2007 | |

OTHER PUBLICATIONS

Maching translation of DE-10015726-A1, Fischer, Oct. 2001, espacenet.com.*
McCann, Allison; "Okay, but how do touch screens actually work?"; Scienceline, Jan. 2012; https://scienceline.org/2012/01/okay-but-how-do-touch-screens-actually-work/ (Year: 2012).*
Heimermann Matthias, machine translation of DE-102010048746-A1, Apr. 2012, espacenet.com (Year: 2012).*
Maeckel Rainer, machine translation of DE-10015726-A1, Oct. 2001, espacenet.com (Year: 2001).*
Notice to Submit Response from Korean Intellectual Property Office for application 10-2015-0191173, dated Apr. 3, 2017 (9 pages).
Notice of Decision For Final Rejection from Korean Intellectual Property Office for application 10-2015-0191173, dated Aug. 1, 2017 (3 pages).
Search Report from German Patent Office for related application EP15198448, dated May 20, 2016 (11 pages).
Translation of The Second Office Action from the State Intellectual Property Office of the People's Republic of China for related application 201511022846.6, dated Apr. 26, 2018 (14 pages).
Translation of The First Office Action from the State Intellectual Property Office of the People's Republic of China for related application 201511022846.6, dated Aug. 2, 2018 (14 pages).

* cited by examiner

APPARATUS AND METHOD FOR ASSISTING A USER

CROSS REFERENCE TO RELATED APPLICATIONS

This application claims priority to and the benefit of German (DE) Patent Application Number DE 10 2015 200 006.0, filed 2 Jan. 2015, the disclosure of which is now expressly incorporated herein by reference.

FIELD OF THE DISCLOSURE

The present disclosure relates generally to a transportation means, and more specifically to a device and method for assisting a user of the transportation means.

BACKGROUND

The present disclosure concerns a transportation means, a device and a method for assisting a user prior to an activating of a switch for electric motor adjustment of a component of a transportation means. In particular, the present disclosure concerns an output of information to a user when he comes close to the switch of an operating element for adjustment of a seat function.

Modern interiors of motor vehicles have an increasing variety of adaptation options. Examples of these are the operator elements of the electrical seat adjustment, which are sometimes found on the seat console of vehicles (cover of the basic seat unit). When the doors are closed, these operator elements cannot be seen and are hard to operate due to the lack of room between the door and the seat (or its seat console). Seat operating elements in the middle console, near the parking brake, are also known, so that they are visible to the vehicle passengers. The design space in the doors is very limited due to door openers, door handle, switches for electric window opener and mirror, loudspeaker, etc. The design space in the center console is very limited due to the gear shift lever, cup holder, stowage compartments, switches for chassis adjustments and the parking brake. Furthermore, a whole host of switches becomes confusing and is undesirable for esthetic reasons.

DE 10 2005 054 171 A1 discloses a method for monitoring of motor operated vehicle components, in which an approaching of a button is recognized for purposes of pinch protection (for example, in the process of operating a sun roof of a vehicle).

DE 10 2011 018 378 A1 discloses a device for positioning an element in a motor vehicle in which a proximity sensor is provided to recognize a particular approach pattern to the element. In this way, positioning commands for the element can be detected without the presence of mechanical switches. Proximity sensors are also disclosed for adjusting a seat part, which the user operates by swiping his hand over the corresponding seat part.

WO 2007/121977 A2 discloses a control system for a vehicle dash board in which navigation can be done with a screen menu, by recognition of user gestures on a steering wheel. It is proposed here to visualize a completed seat adjustment on the display.

The above identified objects of the prior art do not fully exhaust the technical possibilities for assisting a user in the course of the operation of a vehicle function.

Therefore, one problem which the present disclosure proposes to solve is to handle and satisfy the above indicated need.

SUMMARY OF THE DISCLOSURE

The present disclosure may comprise one or more of the following features and combinations thereof.

The above identified problem is solved according to the disclosure by a transportation means, a device, as well as a method for supporting a user prior to an activating of a switch for electric motor adjustment of a component of a transportation means. For this, first of all an approaching of the user (e.g., his hand) to a first switch of the transportation means is recognized. By "approaching" is meant in the context of the present disclosure a presence of an input means in an area near to the switch without contacting the switch. By switch is meant in the context of the present disclosure an electromechanical operating device for the control of parts of the transportation means which can be moved by electric motor. In particular, the switch comprises a reversibly (e.g., galvanically) closable electric contact. In particular, a switch in the context of the present disclosure is not understood as being a capacitive data entry surface.

In a second step, a prompting of a function coordinated with the first switch is displayed. The prompting can be indicated, for example, on a central information display and/or an instrument cluster. Alternatively, the prompting can be displayed as a light signal/illuminated symbol by a lighting means arranged on the switch itself, after a predefined approach of the user to the switch has been recognized. Already prior to the operating of the switch (e.g., before the opening/closing of the electric contact to be influenced by the switch), the user is informed as to the possibility of adjusting the part. In this way, one drawback of operating units which are hard for the user to perceive visually is mitigated in terms of user friendliness. In particular, mechanical switches can be moved out of the optical focus of the passengers so that the passenger space appears more roomy and the users can have a better orientation.

The subclaims show preferred modifications of the disclosure.

The function can be, for example, a seat adjustment and/or a mirror adjustment and/or a sun roof adjustment or an adjustment of a sun screen. As mentioned above, on the example of a seat adjustment a first switch or a cluster of first switches to adjust the seat position can be arranged in the area of the vehicle seat (e.g., on a console). The same holds for the other aforementioned function variants. Depending on which of the first switches the user swipes or which first switch he approaches, another prompt can be put out on the screen. For example, a component of the part which can be adjusted electromotively by means of the respective first switch can be optically displayed and, in particular, highlighted in a summary of several components. In this way, the user can receive an optical feedback as to which component is being acted upon by an operation of the switch and which effect such an operation of the switch will have or has had. Thus, adjustments of the seat position can be done specifically and avoiding wrong moves which needlessly hamper the onboard electrical system and cause wear and tear.

Preferably, a gesture of the user performed under contact with a surface of the switch and/or in a detection area prior to the switch can also be detected and recognized. For this, one can use capacitive and/or optical and/or ultrasound-based sensors, for example. In response to the recognized user gesture, a control command coordinated with the input can be put out to an electric motor for the adjustment of the part. The control command can undertake the electric motorized adjustment of the part of the transportation means in a manner or a direction which is coordinated with the recognized user gesture.

The prompt can comprise, for example, an image of a seat in which the separately operated elements as such are shown optically separate from each other. Alternatively or in addition, a function of the part coordinated with the switch can be made identifiable. This can involve an animation and/or some other representation of possible positions of the part. In particular, the part related to the function of the switch which is approached can be optically emphasized, especially by being shown magnified and/or in color. This does not rule out several switches being approached, operated, and included accordingly in the displayed prompt (e.g., emphasized and/or animated).

Once the prompt is displayed on the screen, an input of the user in regard to the prompt can be detected by a specially provided detection device (such as a touch screen, a proximity sensor, or the like) and a control command corresponding to the input can be put out to an electric motor for adjustment of the part. In other words, the prompt can have a screen representation comprising switch surfaces, so that the user simply by approaching the switch (e.g., on the seat console) can perform a software-based control of the seat position. As is known, screens with touch sensitive surface afford much more extensive and sometimes more comfortable operating possibilities for the entry of commands. As compared to a permanent operation of the first switch for the gradual seat adjustment, a user can freely designate seat positions on the screen or by means of a proximity sensor, preferably also making use of 3D gestures which are freely executed in space and detected by sensor, and these will then be realized fully automatically without the user having to constantly provide a corresponding input for this. Especially for calling up previously memorized seat positions, the possibility now exists of calling up a seat position by a pointwise entry (e.g., on a predefined switch surface) and then return his attention at once to the driving process, leaving the onboard electrical system of the transportation means to do the rest. Instead of first calling up a menu with the aid of a universal operator element to adjust a seat position, the user by merely approaching the first switch can call up the aforementioned menu item for adjusting the seat position, define a desired seat position quickly and comfortably, and end the selection process within fractions of a second, so that the full attention of the driver is only briefly distracted from the driving process.

According to a second aspect of the present disclosure, a device is proposed for assisting a user prior to operating a switch for the electric motorized adjustment of a component of a transportation means. The device comprises a first switch, which is provided to the electric motorized adjustment of a first component of the transportation means. A first proximity sensor is disposed to recognize an approaching of the user to the first switch. In particular, the proximity sensor can be arranged within the first switch. Such sensors can comprise, for example, capacitive sensors. In response to the approach, a signal is sent to display a prompt to a function coordinated with the first switch (e.g., on a screen of the transportation means). In other words, the proximity sensor in response to the approach of the user can arrange to call up a screen content comprising the prompt. Alternatively or in addition, the prompt can be put out as a light signal/illuminated symbol by a lighting means arranged on the switch itself. For this, the device can have a diaphragm with a translucent pictogram and the lighting means can be disposed behind the diaphragm. An optical fiber can be arranged to relay between the lighting means and the diaphragm and be configured as a diffuser for a homogeneous distribution of light. In this way, the user is informed as to which functionality an operation of the switch close to his hand will have.

In addition, a second switch can be provided for the electric motorized adjustment of a second component of the transportation means. The second switch can be coordinated for example with a back rest of a seat, while the first switch changes the position of the sitting surface of the seat. A second proximity sensor is disposed to recognize an approach of a user to the second switch. This can be done, in particular, independent of an approach of the user to the first switch. In response to this, a signal is sent to display a prompt to a function coordinated with the second switch (e.g., on the screen of the transportation means or according to an alternative discussed in connection with the first switch). In other words, an approaching of the second switch brings about the calling up of a prompt which pertains to the function coordinated with the second switch, i.e., an electric motorized adjustment of the second component. As described above, the prompt can also have a switch surface or several switch surfaces in this connection, by means of which the user can even more comfortably and preferably freely select individual positions for the component.

The device can furthermore comprise an input device for recognition of user gestures performed under contact with a surface of the first switch and/or in a detection area in front of the first switch. Moreover, an evaluation unit can be provided, which is designed to put out a control command, coordinated with the input in response to a predefined user gesture, to an electric motor for adjustment of the component. The input device can for example detect the hand of the user, its position, its orientation, even down to whether the fingers are curved or outstretched, by capacitive, optical, or ultrasound means, and transform the latter into electric signals, which can be processed by the evaluation unit, so that an electric motorized adjustment of a component of the transportation means can occur already before an operation of the switch. Furthermore, thanks to the gesture recognition there may be no need for switch surfaces or even switches, so that the number of switches implemented by hardware in the device can be reduced or the range of their functions increased for the same number of switches.

Moreover, the device can comprise a lighting means and a diaphragm arranged over the first switch or next to the first switch, the diaphragm having a translucent region shaped in the form of a pictogram and the lighting means being designed to scatter light through the diaphragm in response to a control signal of the first proximity sensor. The diaphragm can be configured, for example, as a paint layer on the underside of an otherwise translucent cover, while the pictogram can be produced as an engraving or by masking of a corresponding region during the painting process.

The device can preferably comprise a touch sensitive surface coordinated with the screen, being designed to trigger, in response to an activating of an operating element depicted on the screen, a control command to produce a position of the component corresponding to the control command. In other words, the prompt is designed to receive user input regarding predefined seat positions and then to trigger a fully automatic production of the corresponding position of the component. There may be no need for an ongoing activation of a first or second switch or a switching surface coordinated with the switches on the touch sensitive surface, which minimizes the potential for distraction of the activation process.

The proximity sensor can comprise a capacitive sensor and/or an optical sensor and/or an ultrasound sensor. Thanks to the aforementioned principles of operation, the sensor can be robust, small and cheap. In particular for capacitive sensors and ultrasound sensors, no malfunctioning due to dirt and grime is to be feared. The optical sensor can be configured, for example, as a camera (2D/3D camera), which monitors the interior of the transportation means. If the user's hand or other body part is recognized in the region of the first switch or the second switch, the camera or an image evaluation unit (which is able to perform an object and/or edge recognition) puts out the prompt according to the disclosure. In this way, different switches in the interior can be monitored by only one sensor in regard to an approach of the user.

According to a third aspect of the present disclosure, a transportation means is proposed which comprises a device for the assisting of a user prior to an activating of a switch for the electric motorized adjustment of a component of a transportation means according to the second mentioned aspect of the disclosure. The features, combinations of features, and benefits resulting from them correspond to those mentioned in connection with the second mentioned aspect of the disclosure, so that to avoid repetition reference is made to the foregoing remarks.

According to another aspect of the present disclosure, a method for assisting a user prior to an activating of a switch for electric motor adjustment of a component of a transportation means is disclosed. The method comprising the steps of recognizing of an approach of the user to a first switch and, in response to this, displaying of a prompt to a function coordinated with the first switch.

In some embodiments, the function includes one or more of a seat adjustment, a mirror adjustment, a sun roof adjustment, and an adjustment of a sun screen. In some embodiments, the prompt is put out on a screen or generated by a lighting means disposed on the first switch.

In some embodiments, the method further comprises recognizing of a user gesture performed under contact with a surface of the switch in a detection area in front of the switch and, in response to this, putting out a control command coordinated with the input to an electric motor for the adjustment of the component. In some embodiments, the prompt comprises an image of one or more of a seat, a mirror, a sun roof, a sun screen, and reveals a function of the component coordinated with the switch.

In some embodiments, the prompt is put out on a screen and the method further comprises detecting an input regarding the prompt by means of a detection device coordinated with the screen and putting out a control command coordinated with the input to an electric motor for adjustment of the component. In some embodiments, at least one of the first switch and the second switch is designed for installation on one or more of a seat, a mirror triangle, and a roof module for operation of a sun roof included in the transportation means.

According to an aspect of the disclosure, a device includes a first switch and a first proximity sensor. The first switch is configured for the electric motorized adjustment of a first component of a transportation means. The first proximity sensor is disposed to recognize an approaching of a user to the first switch and in response to this send a signal to display a prompt to a function coordinated with the first switch.

In some embodiments, the device further includes a second switch which is provided for the electric motorized adjustment of a second component of the transportation means and a second proximity sensor which is disposed to recognize an approaching of a user to the second switch and in response to this send a signal to display a prompt to a function coordinated with the second switch. In some embodiments, the device further includes an input device for recognizing of a user gesture performed under contact with a surface of the first switch in a detection area in front of the first switch and an evaluation unit, wherein the evaluation unit is designed to put out a control command coordinated with the input to an electric motor for adjustment of the component in response to a predefined user gesture.

In some embodiments, the device further includes a lighting means and a diaphragm disposed above the first switch or next to the first switch. The diaphragm has a translucent region shaped in the form of a pictogram and the lighting means is designed to scatter light through the diaphragm in response to a control signal of the first proximity sensor.

In some embodiments, the device further comprises a screen for the display of the prompt and a touch sensitive surface coordinated with the screen being designed to trigger, in response to an activating of an operating element depicted on the screen, a control command to produce a position of the component corresponding to the control command. In some embodiments, at least one of the first switch and the second switch is designed for installation on one or more of a seat, a mirror triangle, and a roof module for operation of a sun roof included in the transportation means.

In some embodiments, the proximity sensor comprises one or more of a capacitive sensor, an optical sensor, and an ultrasound sensor. In some embodiments, the device further comprises a transportation means.

According to another aspect of the present disclosure, a method for assisting a user prior to an activating of a switch for electric motor adjustment of a component of a transportation means comprises the steps of recognizing of an approach of the user to a first switch and in response to this displaying of a prompt to a function coordinated with the first switch.

In some embodiments, the function is a seat adjustment and/or, a mirror adjustment and/or, a sun roof adjustment and/or, an adjustment of a sun screen. In some embodiments, the prompt is put out on a screen or generated by a lighting means disposed on the first switch.

In some embodiments, the method further comprises recognizing of a user gesture performed under contact with a surface of the switch and/or in a detection area in front of the switch and in response to this putting out a control command coordinated with the input to an electric motor for the adjustment of the component. In some embodiments, the prompt comprises an image of a seat and/or a mirror and/or a sun roof and/or a sun screen and/or reveals a function of the component coordinated with the switch.

In some embodiments, the prompt is put out on a screen. The method further comprises detecting an input regarding the prompt by means of a detection device coordinated with the screen and putting out a control command coordinated with the input to an electric motor for adjustment of the component.

According to another aspect of the disclosure, a first switch for the electric motorized adjustment of a first component of a transportation means and a first proximity sensor which is disposed to recognize an approaching of a user to the first switch and in response to this send a signal to display a prompt to a function coordinated with the first switch.

In some embodiments, the device further comprises a second switch which is provided for the electric motorized adjustment of a second component of the transportation means and a second proximity sensor, which is which is disposed to, recognize an approaching of a user to the second switch and, in response to this, send a signal to display a prompt to a function coordinated with the second switch.

In some embodiments, the device further comprises an input device for recognizing of a user gesture performed under contact with a surface of the first switch and/or in a detection area in front of the first switch and in response to this, and an evaluation unit, wherein the evaluation unit is designed to put out a control command coordinated with the input to an electric motor for adjustment of the component in response to a predefined user gesture.

In some embodiments, the device further comprises a lighting means and a diaphragm disposed above the first switch or next to the first switch, wherein the diaphragm has a translucent region shaped in the form of a pictogram and the lighting means is designed to scatter light through the diaphragm in response to a control signal of the first proximity sensor.

In some embodiments, the device further comprises a screen for the display of the prompt and a touch sensitive surface coordinated with the screen, being designed to trigger, in response to an activating of an operating element depicted on the screen, a control command to produce a position of the component corresponding to the control command.

In some embodiments, the first switch and/or the second switch is designed for installation on a seat and/or on a mirror triangle and/or on a roof module for operation of a sun roof of the transportation means.

In some embodiments, the proximity sensor comprises a capacitive sensor and/or optical sensor and/or ultrasound sensor.

In some embodiments, a transportation means comprises the device according to one of the preceding paragraphs.

These and other features of the present disclosure will become more apparent from the following description of the illustrative embodiments.

BRIEF DESCRIPTION OF THE DRAWINGS

Sample embodiments of the disclosure shall be described in detail below, making reference to the enclosed drawings. The drawings show.

DETAILED DESCRIPTION OF THE DISCLOSURE

Figure 1:
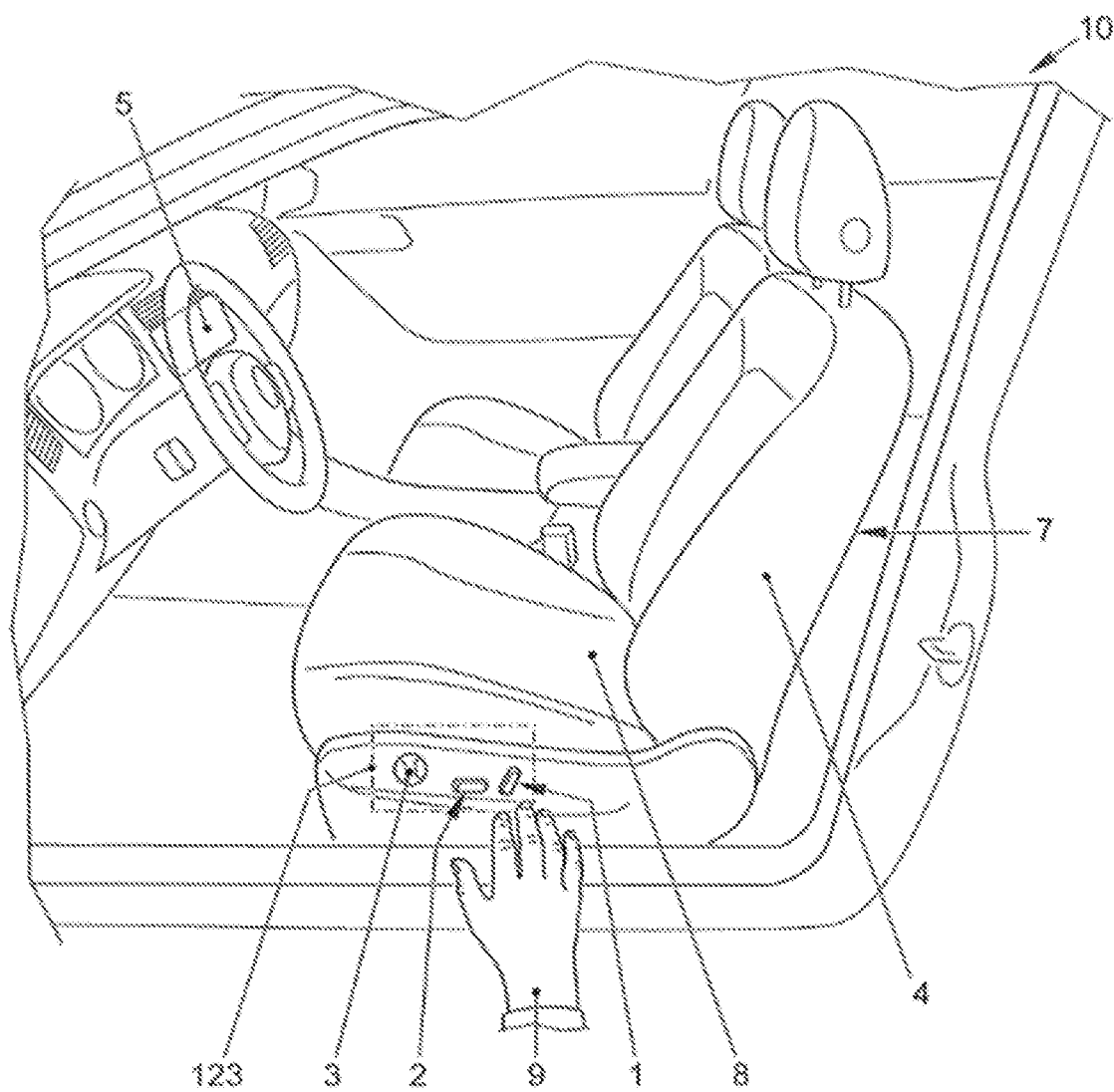
FIG. 1 is a perspective view of a vehicle interior outfitted according to the disclosure when operating a first switch by hand of a user.

For the purposes of promoting an understanding of the principles of the disclosure, reference will now be made to a number of illustrative embodiments illustrated in the drawings and specific language will be used to describe the same.

FIG. 1 shows the interior of a car 10 as the transportation means, in which a first switch field 123 for the operation of an electric motorized adjustment of the driver's seat 7 is represented as the electric motorized adjustable component of the car 10. A first switch 1 of the first switch field 123 is coordinated with an adjustment of an inclination of the seat back 4. A second switch 2 of the first switch field 123 is coordinated with an adjustment of a position of the sitting surface 8 of the driver's seat. A third switch 3 of the first switch field 123 is coordinated with an adjustment of a lower back support (not shown) of the driver's seat 7. An approach by a user's hand 9 to the first switch field 123 is recognized by a capacitive proximity sensor (not shown) inside the first switch 123, in response to which a prompt coordinated with the seat adjustment is shown on a central information display as the screen 5 of the car 10.

Figure 2:
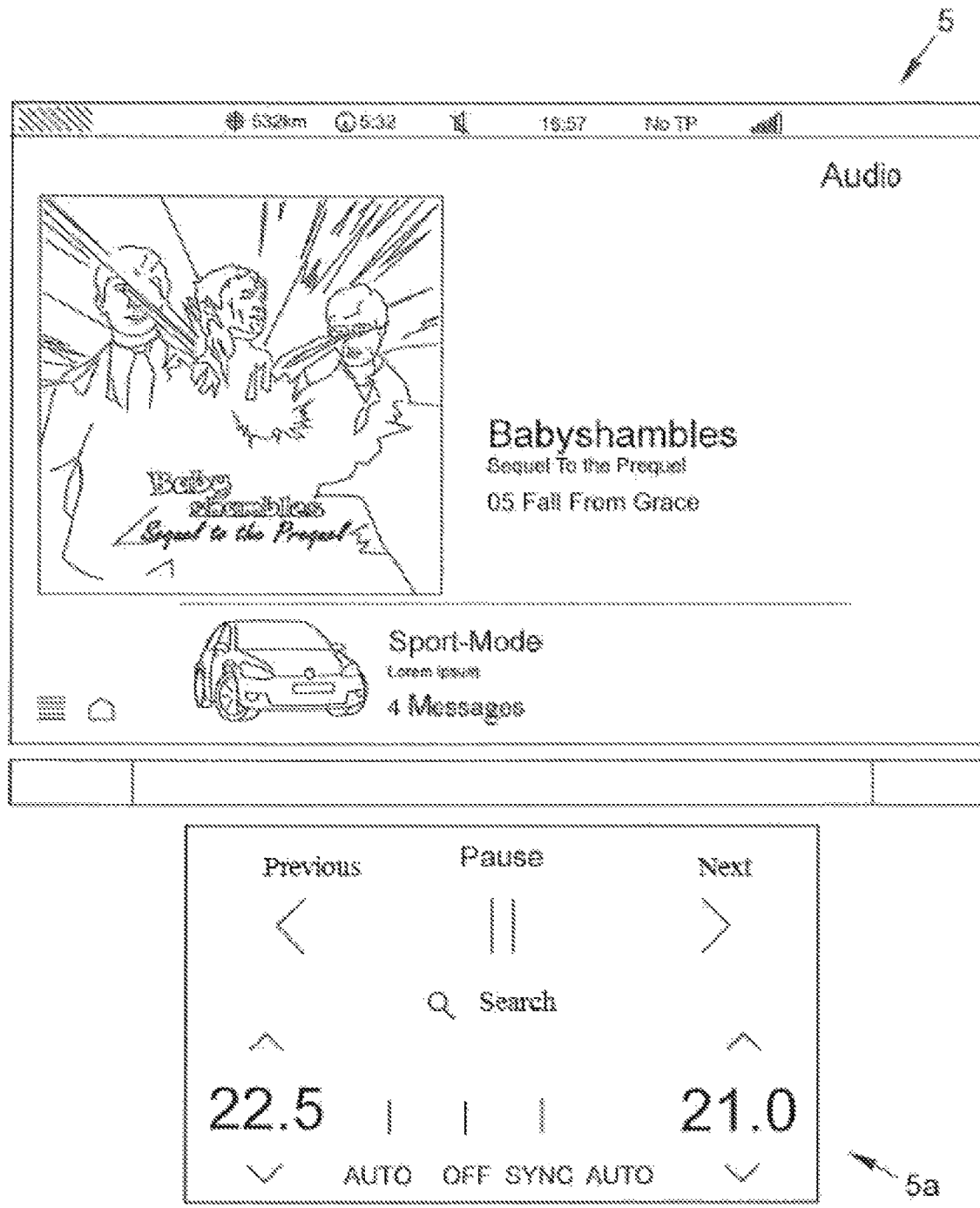
FIG. 2 is a view of a screen prior to a detected approaching of the first switch depicted in FIG. 1.

FIG. 2 shows a content of the screen 5 prior to recognizing of an approach to the first switch field (reference symbol 123 in FIG. 1). The screen content represents information regarding a current audio playback. Furthermore, a chassis mode and the presence of unread text messages are provided. Below the screen 5 there is a small display region 5a for the operation of the audio playback and climate controls. These elements of the screen contents have no substantive relationship with the functions of the switch field for the operating of an electric motorized adjustment of the driver's seat.

Figure 3:
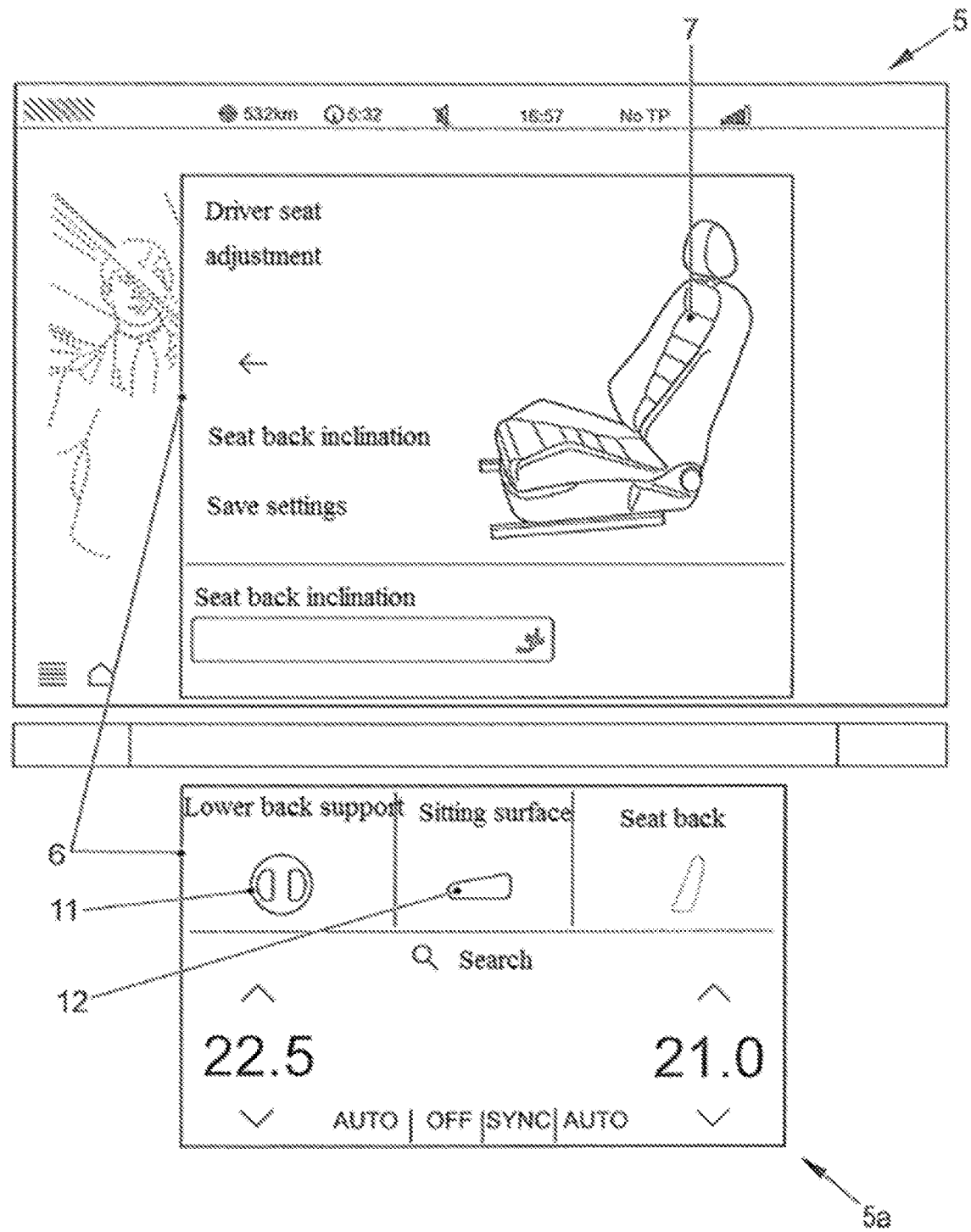
FIG. 3 is a view of a screen after a detected approaching of the first switch depicted in FIG. 1.

FIG. 3 shows the screen view represented in FIG. 2 after a successful recognition of an approach of the user's hand to the first switch field (reference symbol 123 in FIG. 1). The approach according to the disclosure results in a prompt 6 being shown both on the central information display 5 and on the smaller display region 5a, which informs the user as to the functions coordinated with those switch elements which he has just approached. For this, the diagram of a driver's seat 7 is represented. Furthermore, it is indicated in text form that an activating of the currently approached first switch will influence the inclination of the seat back. Furthermore, the user is asked if he wants to save the current settings. Also in the smaller display area a prompt is shown for the seat adjustment in response to the approach. Various switch surfaces 11, 12 enable a touch input to adjust the lower back rest or the sitting surface.

Figure 4:
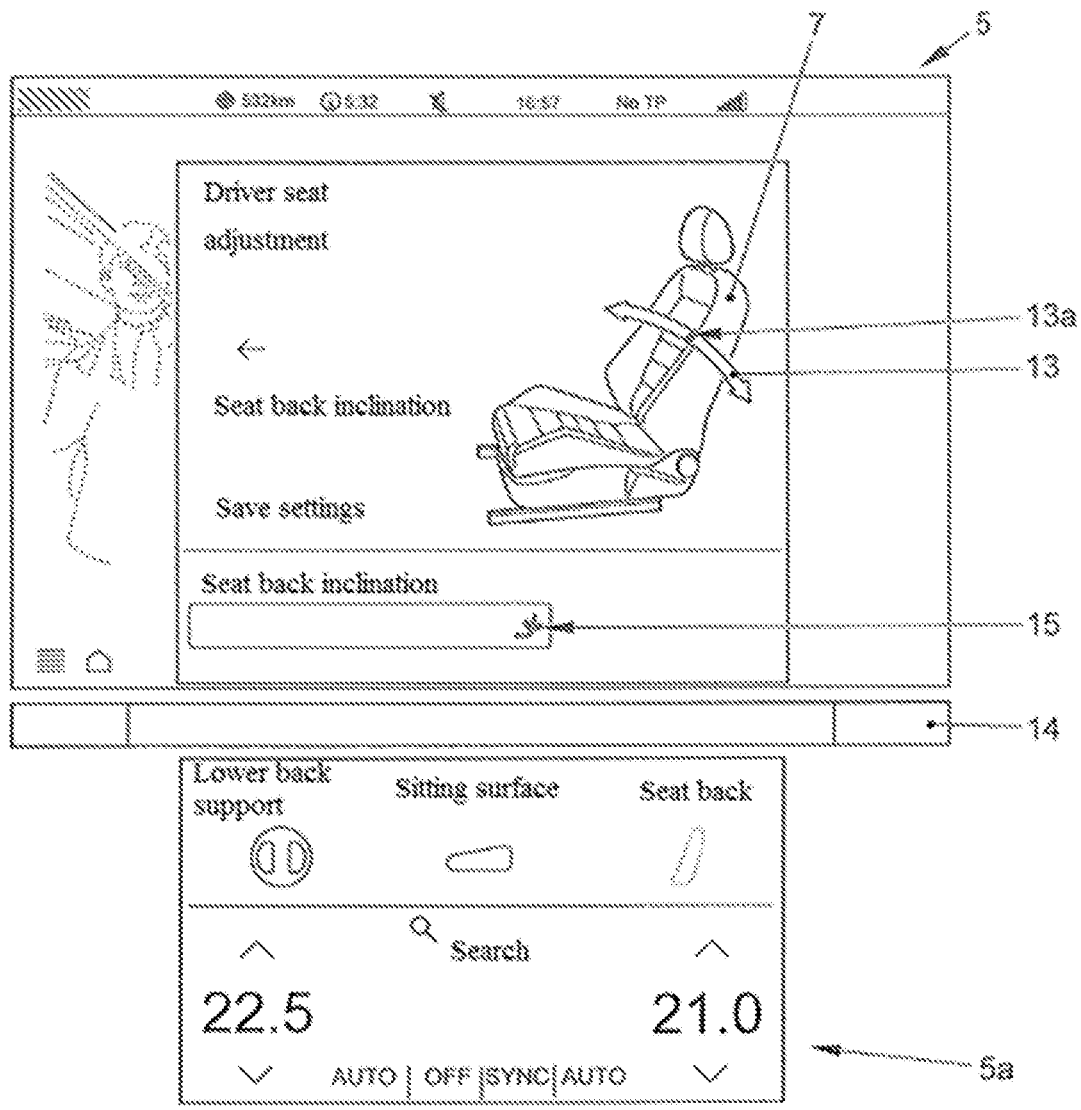
FIG. 4 is an illustration of a prompt, comprising a slider for arbitrary adjusting of a position of a seat back.

FIG. 4 shows an alternative representation of the prompt 6 (see FIG. 3), in which the back rest of the driver's seat 7 is shown with a superimposed slider control element 13. This also can be shown according to one sample embodiment of the present disclosure in response to an approaching of the user's hand to a first switch coordinated with the seat back and then be operated via the touch sensitive surface of the central screen 5. The user can either type in a position on the slider control 13, in response to which the selected position is realized automatically by electric motor. Or the user can grasp an indicator 13a for a current position of the back rest and slide this to a desired position of the slider control 13. In response to this, the respective position of the indicator 13*a* is also realized as soon as possible for the back rest of the driver's seat 7. Between the central information display 5 and the smaller display region 5*a* there is arranged a horizontally disposed capacitive slider 14, by which a redundant input for adjustment of a component of the electric motorized adjustable seat activated within the prompt can be performed. A prompt 15 on the central information display 5 shows which component is involved in the input through the capacitive slider 14.

Figure 5:
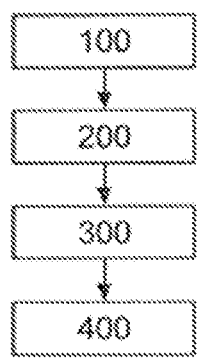
FIG. 5 is a flow chart illustrating steps of a sample embodiment of a method according to the disclosure.

FIG. 5 shows steps of a sample embodiment of a method according to the disclosure for assisting a user prior to an activating of a switch for electric motorized adjustment of a component of a transportation means. In step 100, an approach of the user to a first switch is recognized. In response to this, in step 200, a prompt is shown on a screen to a function coordinated with the first switch. The prompt also comprises switch surfaces for receiving user input. In step 300, an input regarding a switch surface of the prompt is detected by means of a detection device coordinated with the screen in the form of a touch sensitive surface. In step 400, a control command coordinated with the input is put out to an electric motor for moving the electric motorized adjustable component. During this process, the user can devote himself once more fully to the driving process, so that the traffic safety is impaired the least possible by the method according to the disclosure.

Figure 6:
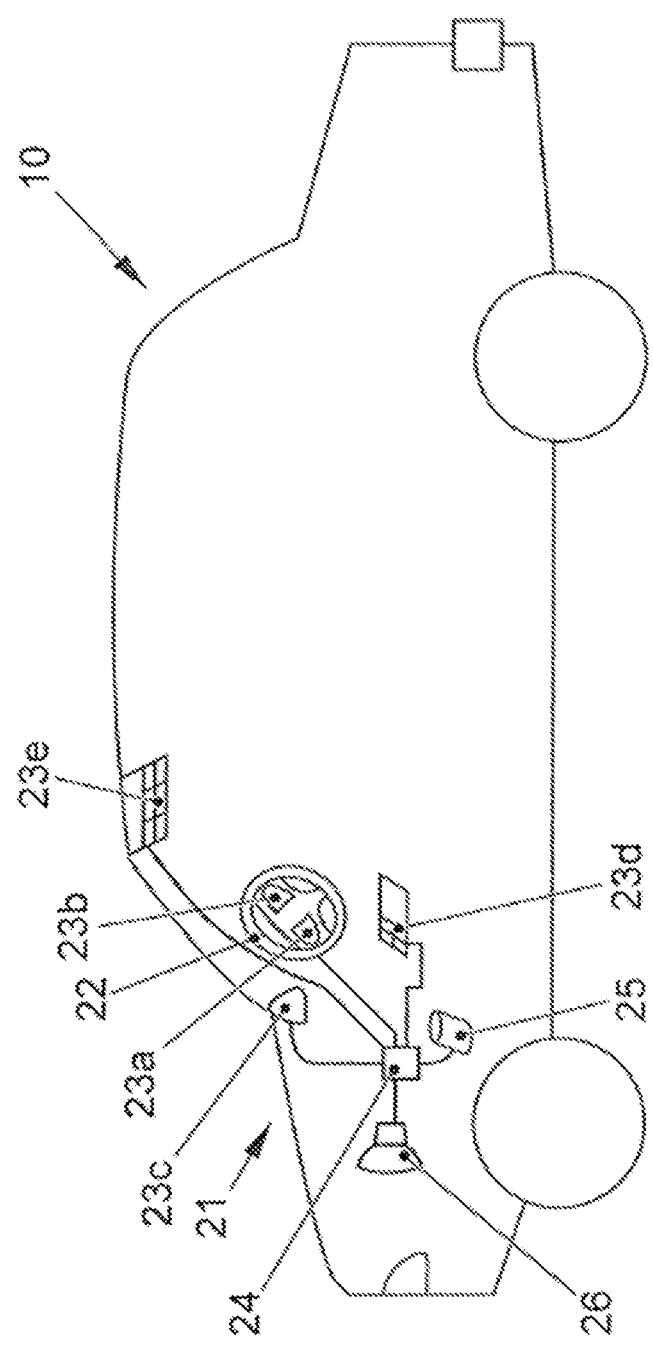
FIG. 6 is a schematic survey of components of an alternative sample embodiment of a transportation means according to the disclosure with an alternative sample embodiment of a user interface according to the disclosure.

FIG. 6 shows a car 10 as the transportation means, which has a user interface 21 with five switch units each configured according to the disclosure. The permanently opaque covers 23*a*, 23*b*, 23*c*, 23*d*, 23*e* of the switch units are coordinated with two sides of a steering wheel 22 as well as a mirror triangle, a window opener module in a door (not shown) and a sun roof module for controlling a sun roof and an interior lighting. The units are connected to a shared electronic controller 24 as a sample embodiment of an evaluation unit, which additionally has a data connection to a data storage 25. The data storage 25 saves for example references for predefined user gestures and limit values for acting forces. Finally, a loudspeaker 26 is also provided, which is shown only symbolically as an example outside of the covers 23*a*, 23*b*, 23*c*, 23*d*, 23*e* for acoustic feedback to the user.

Figure 7:
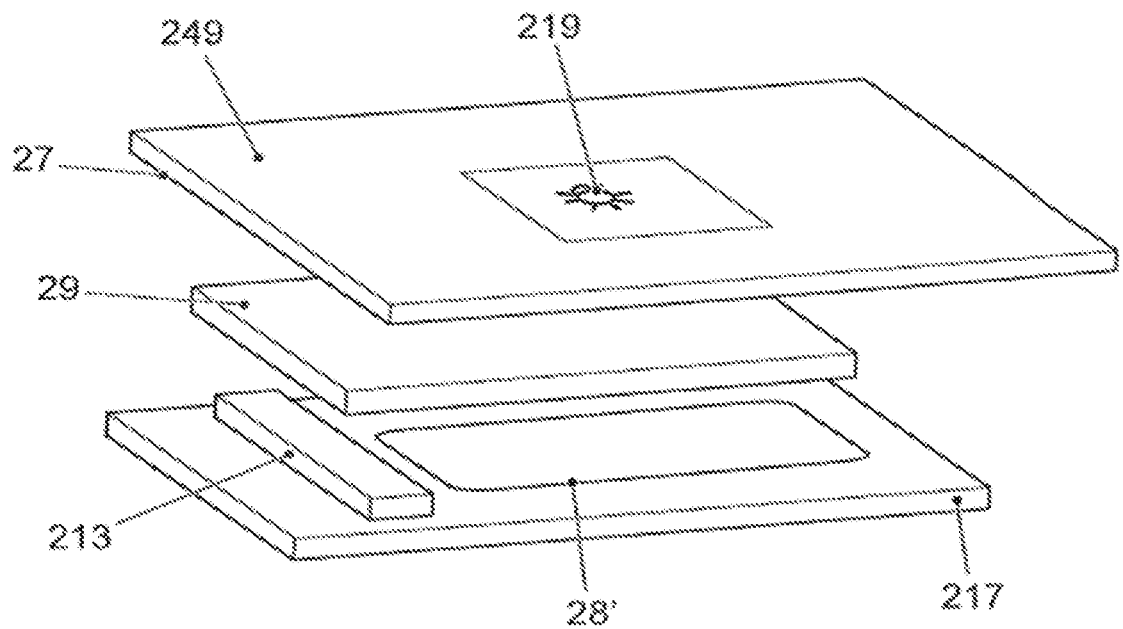
FIG. 7 is a sectional, perspective view of another sample embodiment of a user interface according to the disclosure.

FIG. 7 shows a perspective representation of a schematic design of a component of a user interface 21 according to the disclosure in the form of a component which covers the electrical switches 1, 2, 3 in FIG. 1. The cover 249 here is opaque due to a nontransparent black paint coat 27. The symbol 219 is a translucent region produced by engraving in the paint. An optical fiber 29 is provided to direct light scattered from an LED lighting means 213 to the cover 249. A capacitive sensor 28' is arranged on the board 217 for recognition of approach, touch, and swiping gestures.

Figure 8:
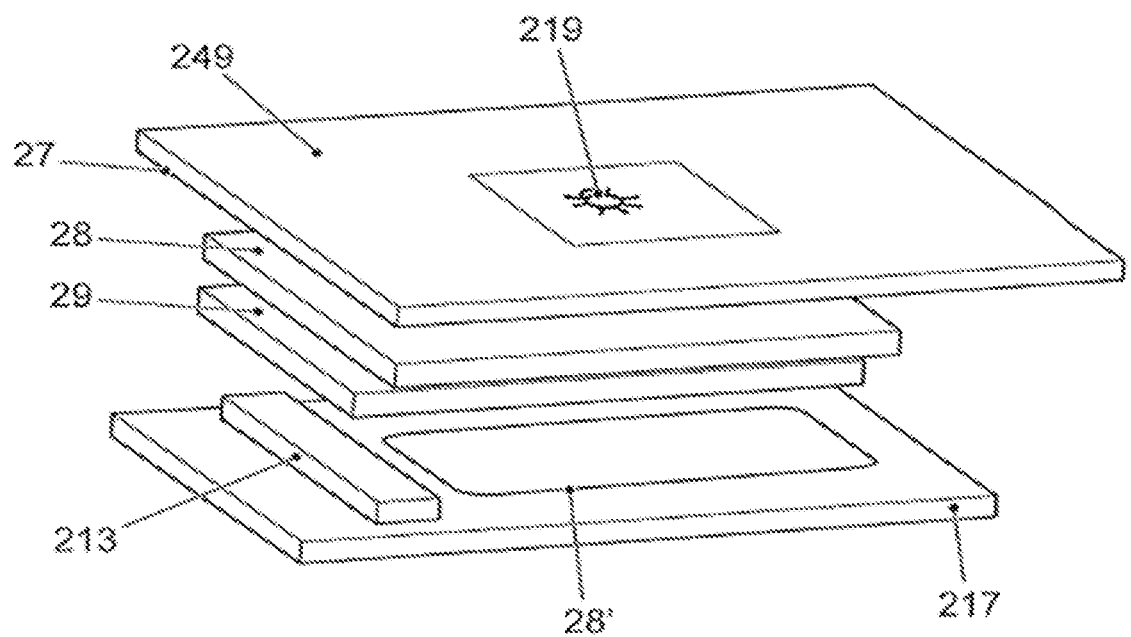
FIG. 8 is a sectional, perspective view of another sample embodiment of a user interface according to the disclosure.

FIG. 8 shows the arrangement represented in FIG. 7, in which a capacitive film 28 has been provided between the surface region 249 and the optical fiber 29 for the recognition of touch contact. Beneath the paint coat 27 is provided a capacitive film for creating the touch sensitive attribute of the user interface. It responds according to the capacitive sensor 28' arranged on the board 217 in FIG. 7 to human tissue, serves for recognizing approach, touch contact and swiping gestures and directs corresponding control commands to an evaluation unit (not shown). The sensor 28' shown in FIG. 7 is provided on the board 217 in addition to the sensor for approach and gesture recognition.

Even though the aspects of the disclosure and advantageous embodiments have been described in detail with the aid of the sample embodiments discussed in connection with the enclosed drawings, modifications and combinations of features of the sample embodiments depicted are possible for the skilled person, without leaving the scope of the present disclosure, whose protected range is defined by the enclosed claims.

LIST OF REFERENCE SYMBOLS

1 Switch for seat back adjustment
2 Switch for sitting surface adjustment
3 Switch for lower back support
4 Back rest
5 Screen, central information display
5*a* Display area
6 Prompt
7 Driver's seat
8 Sitting surface
9 User's hand
10 Car
11, 12 Switching surfaces for selection of the electric motorized adjustable component
13 Slider
13*a* Indicator (slider position)
14 Capacitive slider
15 Indicator for the function coordinated with the slider 14
21 User interface
22 Steering wheel
23*a*, 23*b*, 23*c*, 23*d* Covers
24 Controller
25 Data storage
26 Loudspeaker
27 Paint layer
28 Capacitive film
28' Capacitive sensor
29 Optical fiber
100 Method step
123 Switch field
200 Method step
219 Symbol
213 LED lighting means
249 Cover
300, 400 Method steps While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:

1. A device comprising:
   a first electromechanical switch for controlling a first electric motorized adjustment of a position of a first component of a transportation vehicle; and
   a first proximity sensor configured and positioned to recognize a first approaching of a user to the first switch and, in response, generate a first signal triggering an optical display of a first prompt with regard to a function associated with the first switch;
   an input device configured to recognize a detected input of the user in response to the first prompt, wherein the recognized detected user's input is a predefined user gesture carried out under contact with a surface of the first switch and/or in a detection region in front of the first switch;
   an evaluation unit configured in response to the predefined user gesture to, without or prior to operation of the first switch, output a control command associated with the pre-defined user gesture to an electric motor to adjust the first component based on the predefined user gesture.

2. The device of claim 1, further comprising a second electromechanical switch for a second electric motorized adjustment of a second component of the transportation vehicle and a second proximity sensor which is configured and positioned to recognize a second approaching of the user to the second switch and, in response, generate a second signal triggering an optical display of a second prompt, the second prompt in a form of the second component, wherein the optical display of the second prompt is highlighted in a summary of several components, so as to provide optical feedback data of the second switch's capability of controlling a second function of the second component.

3. The device of claim 2, further comprising a screen configured to display the first prompt and the second prompt and wherein the evaluation unit is further configured to generate the control command in response to user activation of an operating element depicted on a touch sensitive surface coordinated with the screen, wherein the control command adjusts the position of the first component or second component of the transportation vehicle.

4. The device of claim 3, wherein at least one of the first switch and the second switch is installed on one or more of a seat, a mirror triangle, and a roof module for operation of a sun roof of the transportation vehicle.

5. The device of claim 2, wherein the first or second proximity sensor comprises one or more of a capacitive sensor, an optical sensor, and an ultrasound sensor.

6. The device of claim 2, wherein at least one of the first switch and the second switch is designed for installation on one or more of a seat, a mirror triangle, and a roof module for operation of a sun roof of the transportation vehicle.

7. The device of claim 1, further comprising a light and a diaphragm disposed over the first switch or next to the first switch,
wherein the diaphragm having a translucent region in a form of a pictogram, and
wherein the light is positioned and configured to emit light through the diaphragm in response to a control signal generated by the first proximity sensor.

8. The device of claim 1, further comprising a screen configured to display the first prompt and a touch sensitive surface coordinated with the screen to generate the control command in response to user activation of an operating element depicted on the screen, wherein the control command adjusts the position of the first component of the transportation vehicle.

9. The device of claim 8, wherein the operating element depicted on the screen is of a vehicle seat with a superimposed slider control element having an indicator configured to be slid by the user to cause the evaluation unit to issue a third control command coordinated with a third input to the electric motor for adjustment of the first component.

10. The device of claim 9, wherein the screen includes a central information display and a display region spaced apart from the central information display and the device further comprises a capacitive slider located between the central information display and the display region and the capacitive slider is configured to be activated by the user to cause the evaluation unit to issue a fourth control command coordinated with a fourth input to the electric motor for adjustment of the first component.

11. The device of claim 1, wherein the first electric motorized adjustment is made by a pointwise entry without operation of the first switch by the user during adjustment of the first component.

12. The device of claim 11, wherein the input device is configured to detect 3D gestures.

13. The device of claim 12, wherein the first proximity sensor comprises a camera configured to recognize a hand or other body part of the user as part of the recognition of the first approaching of the user.

14. The device of claim 1, wherein the evaluation unit outputs the control command automatically in response to the predefined user gesture without operation of the first switch during adjustment of the first component.

15. The device of claim 1, wherein the first proximity sensor includes a camera for recognizing the first approaching of the user, wherein a recognized approaching is an approaching of a hand or other body part of the user, and wherein, the input device is configured to detect 3D gestures made by a user's hand or other body part.

16. The device of claim 1, wherein the first switch is not a capacitive surface.

17. The device of claim 1, further comprising:
a user interface which covers the first switch, the user interface including a board;
the input device including a capacitive sensor arranged on the board and configured to recognize approach, touch, and swiping gestures of the user;
an opaque cover having a symbol defined by a translucent region of the cover;
an LED lighting means located between the board and the opaque cover;
and an optical fiber located between the board and the opaque cover and configured to provide light scattering from the LED lighting means to the cover.

18. The device of claim 1, further comprising:
a screen for the display of the first prompt; and
a touch sensitive surface coordinated with the screen and configured to trigger, in response to user activation, activation of an operating element depicted on the screen, and a second control command to adjust the position of the first component of the transportation vehicle corresponding to the second control command; and,
wherein the operating element depicted on the screen is of a vehicle seat with a superimposed slider control element having an indicator configured to be slid by the user to cause the evaluation unit to output a third control command coordinated with a third input to the electric motor for adjustment of the first component.

\* \* \* \* \*